(12) United States Patent
Kunieda

(10) Patent No.: US 12,089,330 B2
(45) Date of Patent: Sep. 10, 2024

(54) WIRING SUBSTRATE

(71) Applicant: IBIDEN CO., LTD., Gifu (JP)

(72) Inventor: Masatoshi Kunieda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 256 days.

(21) Appl. No.: 17/809,373

(22) Filed: Jun. 28, 2022

(65) Prior Publication Data

US 2023/0007771 A1 Jan. 5, 2023

(30) Foreign Application Priority Data

Jul. 5, 2021 (JP) .................................. 2021-111577

(51) Int. Cl.
 *H05K 1/11* (2006.01)
 *H05K 1/02* (2006.01)
 *G02B 6/10* (2006.01)

(52) U.S. Cl.
 CPC ........... *H05K 1/112* (2013.01); *H05K 1/0274* (2013.01); *G02B 6/10* (2013.01); *H05K 2201/10121* (2013.01); *H05K 2201/10242* (2013.01)

(58) Field of Classification Search
 CPC .............................. H05K 1/122; H05K 1/0274
 USPC ....................................................... 174/211
 See application file for complete search history.

(56) References Cited

U.S. PATENT DOCUMENTS

2008/0317402 A1* 12/2008 Kodama .................. G02B 6/43
 385/14
2009/0016671 A1* 1/2009 Asai ......................... G02B 6/43
 174/262

FOREIGN PATENT DOCUMENTS

JP 2008-129385 A 6/2008

* cited by examiner

*Primary Examiner* — Stanley Tso
(74) *Attorney, Agent, or Firm* — Oblon, McClelland, Maier & Neustadt, L.L.P.

(57) ABSTRACT

A wiring substrate includes an insulating layer, a conductor layer formed on surface of the insulating layer and including a conductor pad, a covering layer covering a portion of the insulating layer, an optical waveguide positioned on the surface of the insulating layer and including core part, and a conductor post including plating metal and formed on the conductor pad such that the post is penetrating through the covering layer and connected to a component. The insulating layer has component region covered by the component when the component is connected, the core part has side surface extending in direction along the surface of the insulating layer, the side surface has an exposed portion exposed in the component region and facing the opposite direction with respect to the insulating layer, and distance between the exposed portion and the surface of the insulating layer is greater than thickness of the covering layer.

20 Claims, 8 Drawing Sheets

WIRING SUBSTRATE

CROSS-REFERENCE TO RELATED APPLICATIONS

The present application is based upon and claims the benefit of priority to Japanese Patent Application No. 2021-111577, filed Jul. 5, 2021, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2008-129385 describes an optical component mounting substrate on a surface of which an optical waveguide and an optical semiconductor element are mounted. The entire contents of this publication are incorporated herein by reference.

SUMMARY OF THE INVENTION

According to one aspect of the present invention, a wiring substrate includes an insulating layer, a conductor layer formed on a surface of the insulating layer and including a conductor pad, a covering layer formed on the insulating layer such that the covering layer is covering a portion of the insulating layer, an optical waveguide positioned on the surface of the insulating layer and including a core part that transmits light, and a conductor post including plating metal and formed on the conductor pad of the conductor layer such that the conductor post is penetrating through the covering layer and connected to a component. The insulating layer has a component region covered by the component when the component is connected to the conductor post, the optical waveguide is formed such that the core part has a side surface extending in a direction along the surface of the insulating layer, that the side surface has an exposed portion exposed in the component region and facing the opposite direction with respect to the insulating layer, and that a distance between the exposed portion and the surface of the insulating layer is greater than a thickness of the covering layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
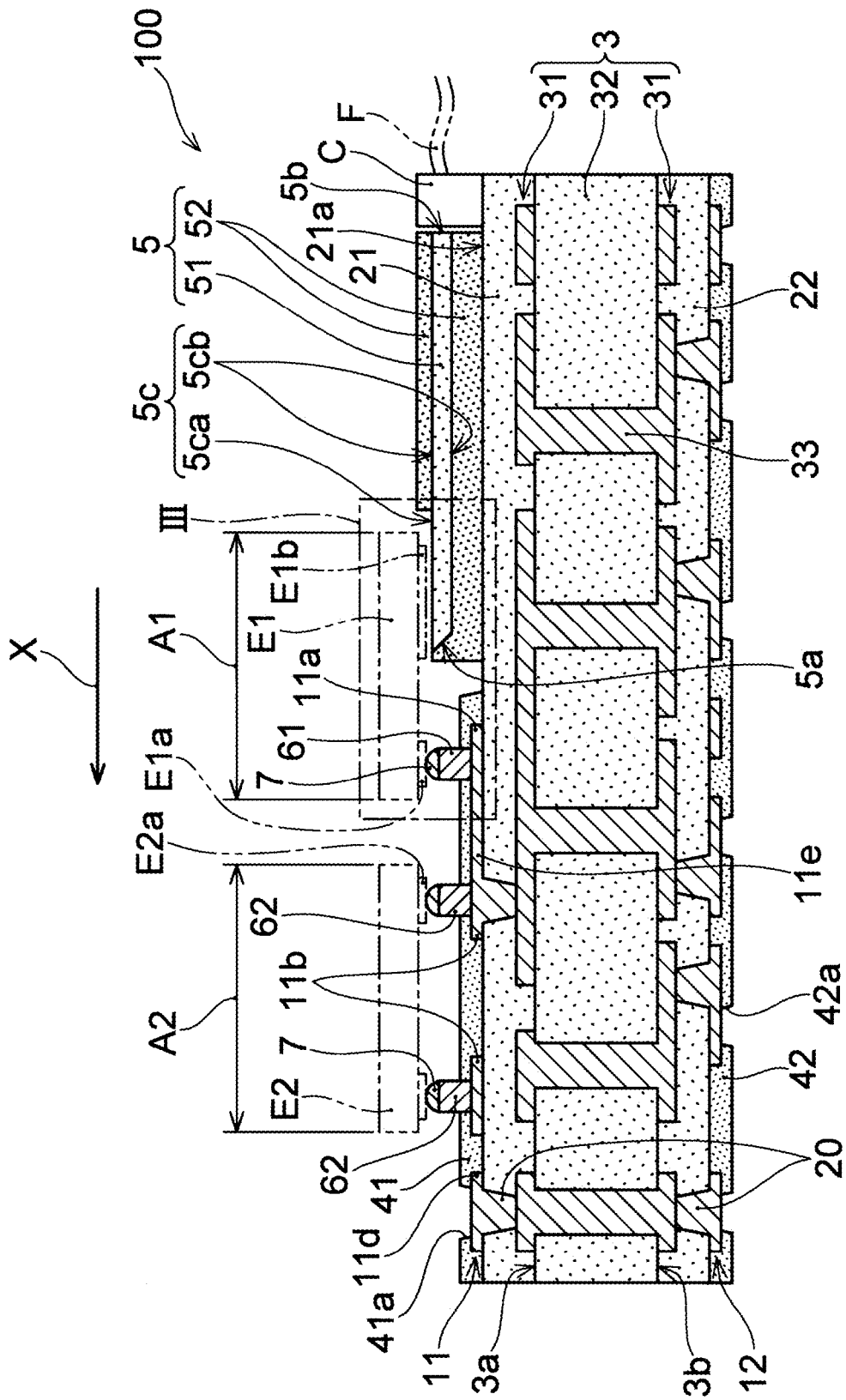
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
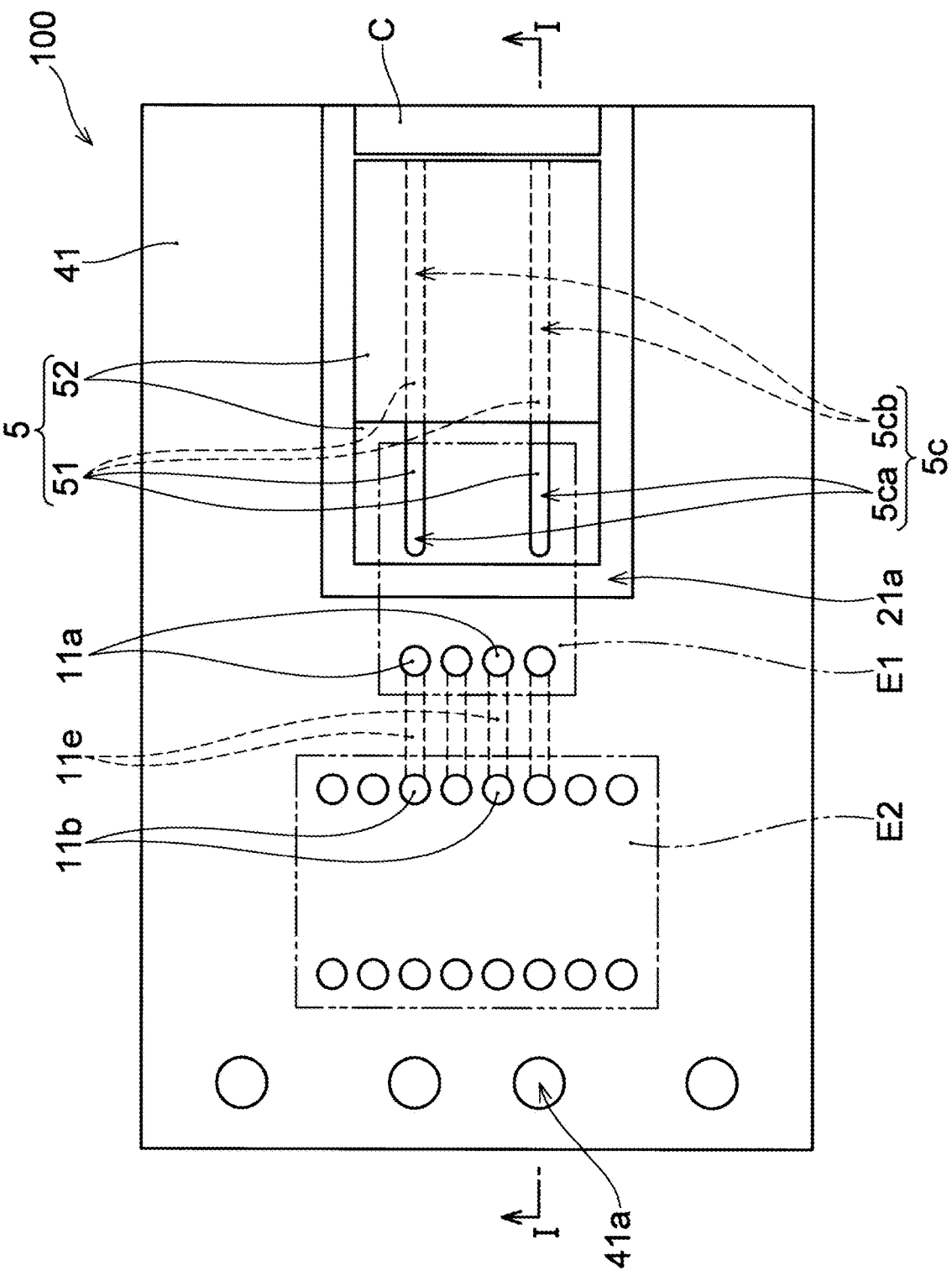
FIG. 2 is a plan view illustrating an example of a surface state of the wiring substrate of FIG. 1.
Figure 3:
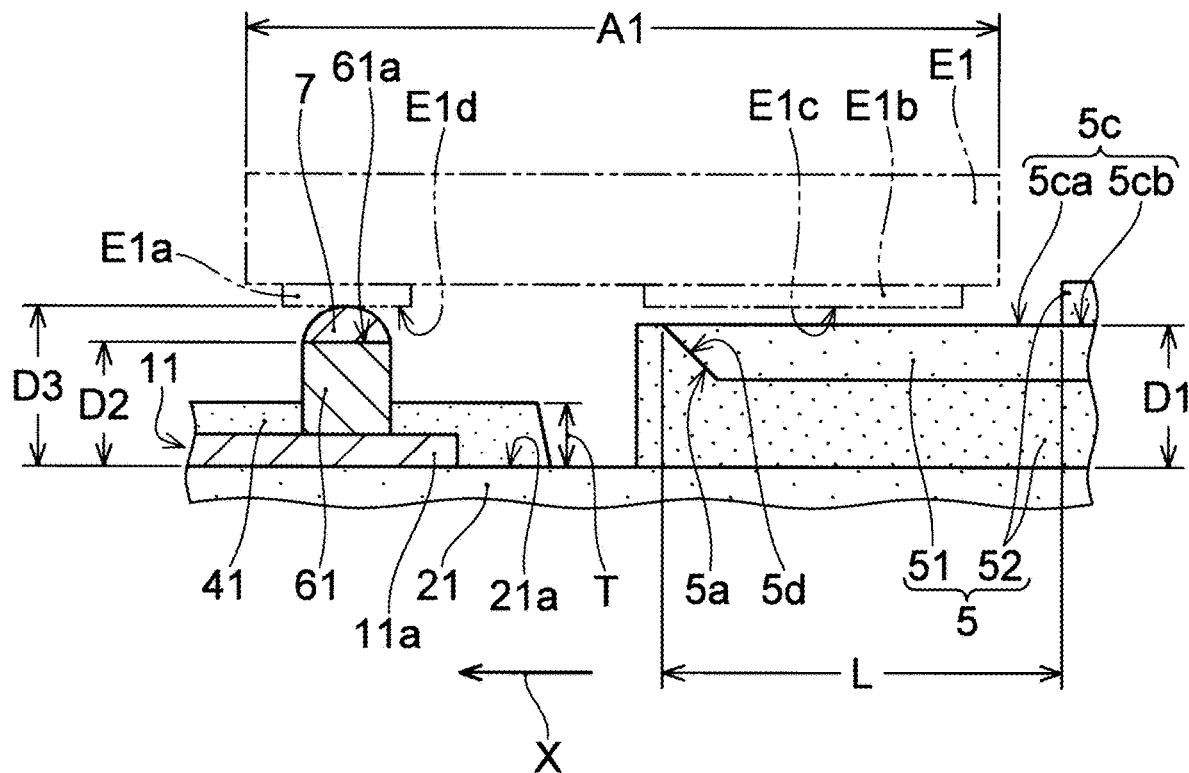
FIG. 3 is an enlarged view of a portion (III) of FIG. 1.

A wiring substrate according to an embodiment of the present invention is described with reference to the drawings. FIG. 1 is a cross-sectional view illustrating a wiring substrate 100, which is an example of the wiring substrate of the embodiment, and FIG. 2 illustrates an example of the wiring substrate 100 of FIG. 1 in a plan view (FIG. 1 is a cross-sectional view along a line (I-I) in FIG. 2). The term "plan view" means viewing the wiring substrate of the embodiment along a thickness direction thereof. FIG. 3 illustrates an enlarged view of a portion (III) of FIG. 1. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and an insulating layer and a conductor layer sequentially laminated on each of two main surfaces (a first surface (3a) and a second surface (3b)) of the core substrate 3 opposing each other in a thickness direction of the core substrate 3. The core substrate 3 includes an insulating layer 32 and conductor layers 31 that are respectively formed on a surface of the insulating layer 32 on the first surface (3a) side and a surface of the insulating layer 32 on the second surface (3b) side. The insulating layer 32 is provided with through-hole conductors 33 that penetrate the insulating layer 32 and connects the conductor layers 31 on both sides of the insulating layer 32 to each other.

In the description of the embodiment, a side farther from the insulating layer 32 in the thickness direction of the wiring substrate 100 is also referred to as an "outer side," "upper side," or simply "upper," and a side closer to the insulating layer 32 is also referred to as an "inner side," a "lower side," or simply "lower." Further, for the conductor layers and the insulating layers, a surface facing the opposite side with respect to the insulating layer 32 is also referred to as an "upper surface," and a surface facing the insulating layer 32 side is also referred to as a "lower surface."

The wiring substrate 100 includes an insulating layer 21 and a conductor layer 11. The insulating layer 21 is laminated on the first surface (3a) of the core substrate 3. The insulating layer 21 has a surface (21a) on the opposite side with respect to the core substrate 3, and the conductor layer 11 is formed on the surface (21a). The wiring substrate 100 further includes a covering layer 41. The covering layer 41 partially covers each of the insulating layer 21 and the conductor layer 11. The covering layer 41 is formed with openings (41a) each of which exposes a part of the conductor layer 11.

On the other hand, an insulating layer 22 is laminated on the second surface (3b) of the core substrate 3. A conductor layer 12 is formed on the insulating layer 22, and a solder resist 42 covering the insulating layer 22 and the conductor layer 12 is formed. The solder resist 42 is formed of, for example, a photosensitive epoxy resin or polyimide resin, or the like. The solder resist 42 is formed with openings (42a) each of which exposes a part of the conductor layer 12. In each of the insulating layer 21 and the insulating layer 22, via conductors 20 connecting the conductor layers that sandwich the insulating layer 21 or the insulating layer 22 to each other are formed.

The wiring substrate 100 further includes an optical waveguide 5 provided on the surface (21a) of the insulating layer 21. As illustrated in FIGS. 1-3, the optical waveguide 5 is provided in a region of the surface (21a) of the insulating layer 21 that is not covered by the covering layer 41. The optical waveguide 5 includes a core part 51 that transmits light and a clad part 52 that is provided around the core part 51. The clad part 52 sandwiches the core part 51 in any direction orthogonal to an extension direction of the core part 51, that is, a propagation direction of light, and surrounds the core part 51 in a plane orthogonal to the propagation direction of light. The optical waveguide 5 is fixed to the surface (21a) of the insulating layer 21 using, for example, an adhesive (not illustrated in the drawings) or the like. The optical waveguide 5 can be fixed to the surface (21a) of the insulating layer 21 by any modes, not limited to an adhesive.

The wiring substrate 100 further includes conductor posts (61, 62) formed on the conductor layer 11. Each of the conductor posts (61, 62) is a conductor having a columnar, frustum-like, or inverted frustum-like shape extending from the conductor layer 11 in the opposite direction with respect to the insulating layer 21. Each of the conductor posts (61, 62) may have any shape in a cross section and a surface orthogonal to the thickness direction of wiring substrate 100. An external component (E1) is connected to the conductor posts 61, and an external component (E2) is connected to the conductor posts 62. That is, the component (E1) and the component (E2) are connected to the wiring substrate 100 when the wiring substrate 100 is used. Therefore, the wiring substrate 100 includes a component region (A1) (first component region), which is a region to be covered by the component (E1) when the wiring substrate 100 is used, and a component region (A2) (second component region), which is a region to be covered by the component (E2) when the wiring substrate 100 is used. The component (E1) connected to the conductor posts 61 is positioned in the component region (A1), and the component (E2) connected to the conductor posts 62 is positioned in the component region (A2). The component (E1) is mounted on the opposite side of the conductor posts 61 and the optical waveguide 5 with respect to the insulating layer 21 side.

Each of the insulating layers (21, 22) and the insulating layers 32 is formed of, for example, an insulating resin such as an epoxy resin, a bismaleimide triazine resin (BT resin) or a phenol resin. Further, although not illustrated, each of the insulating layers may contain a core material (reinforcing material) formed of a glass fiber, an aramid fiber, or the like, and may contain an inorganic filler formed of fine particles of silica ($SiO_2$), alumina, mullite, or the like.

The covering layer 41 is formed of any insulating material. For example, the covering layer 41 may be formed of the same epoxy resin or polyimide resin as the solder resist 42 and may function as a solder resist preventing a short circuit between the conductor posts. Or, the covering layer 41 may be formed of an epoxy resin, a BT resin, or a phenol resin used for interlayer insulating layers such as the insulating layer 21 and the insulating layer 22. That is, the material of the covering layer 41 is not limited to a specific material as long as the covering layer 41 is insulating and can cover predetermined regions of the conductor layer 11 and the insulating layer 21.

The core part 51 and the clad part 52 of the optical waveguide 5 can be formed of an organic material, an inorganic material, or a mixed material such as an inorganic polymer containing an organic component and an inorganic component, the material having an appropriate refractive index. Examples of inorganic materials include quartz glass, silicon, and the like, and examples of organic materials include acrylic resins such as polymethylmethacrylate (PMMA), polyimide resins, polyamide resins, polyether resins, epoxy resins, and the like. Further, inorganic polymers such as polysilane may be used. The core part 51 and clad part 52 may be formed of materials different from each other, or may be formed of materials of the same type. However, for the core part 51, a material having a higher refractive index than that used for the clad part 52 is used. Since total reflection of light incident on an interface between the core part 51 and the clad part 52 at an incident angle equal to or larger than a critical angle is possible, light incident on the core part 51 can efficiently propagate in the core part 51. It is also possible that, after the core part 51 and the clad part 52 are formed using materials having the same refractive index, the refractive indices of the core part 51 and the clad part 52 are made different from each other by appropriate processing. For example, the refractive index of polysilane decreases when irradiated with ultraviolet rays.

The conductor layers (11, 12) and the conductor layers 31, the through-hole conductors 33, the via conductors 20, and the conductor posts (61, 62) and conductor posts 63 (see FIG. 5) (to be described later) can be formed using any metal such as copper or nickel. In FIG. 1, these conductors are simplified and are drawn as each having a one-layer structure. However, each of these conductors may have a multilayer structure including two or more film bodies. For example, each of the conductor layers (11, 12) may have a two-layer structure including an electroless plating film and an electrolytic plating film. The conductor posts (61-63) are formed, for example, of plating metal deposited by electroless plating and/or electrolytic plating.

Each of the conductor layers (11, 12) and the conductor layers 31 may include any conductor patterns. As illustrated in FIGS. 1-3, the conductor layer 11 formed on the surface (21a) of the insulating layer 21 includes at least conductor pads (11a) (first conductor pads). In the example of FIG. 1, the conductor layer 11 further also includes conductor pads (11b) (second conductor pads), conductor pads (11d), and wirings (11e). That is, the conductor pads (11a, 11b, 11d) and the wirings (11e) are provided on the surface (21a) of the insulating layer 21. The wirings (11e) are formed by wiring patterns included in the conductor layer 11. At least one of the conductor pads (11a) and the conductor pads (11b) is connected by the wirings (11e).

The conductor posts 61 are respectively formed on the conductor pads (11a), and the conductor posts 61 are respectively connected to the conductor pads (11a). Therefore, electrodes (E1a) of the component (E1) are electrically connected to the conductor pads (11a) via the conductor posts 61. Similarly, the conductor posts 62 are respectively formed on the conductor pads (11b), and the conductor posts 62 are respectively connected to the conductor pads (11b). Therefore, electrodes (E2a) of the component (E2) are electrically connected to the conductor pads (11b) via the conductor posts 62. The conductor posts 61 protrude from surfaces of the conductor pads (11a) on the opposite side with respect to the insulating layer 21 side and penetrate the covering layer 41. Similarly, the conductor posts 62 protrude from surfaces of the conductor pads (11b) and penetrate the covering layer 41.

When the wiring substrate 100 is used, an electric component that includes a light receiving element and/or a light emitting element and has a photoelectric conversion function is mounted in the component region (A1) as the component (E1). Therefore, the component (E1) in the example of FIGS. 1-3 includes a light receiving or light emitting part (E1b) in addition to the electrodes (E1a). The electrodes (E1a) and the light receiving or light emitting part (E1b) are provided on a surface of the component (E1) facing the wiring substrate 100 side. Examples of the component (E1) include: light receiving elements such as a photodiode; and light emitting elements such as a light emitting diode (LED), an organic light emitting diode (OLED), a laser diode (LD), and a vertical cavity surface emitting laser (VCSEL). When the component (E1) is a light emitting element, the component (E1) generates light based on an electrical signal input to the electrodes (E1a) and emits light from the light receiving or light emitting part (E1b) that functions as a light emitting part. Further, when the component (E1) is a light receiving element, an electrical signal is generated based on light incident on the light receiving or light emitting part (E1b) that functions as a light receiving part and is output from the electrodes (E1a).

Further, in the example of FIG. 1, the component (E2) that can be mounted in the component region (A2) when the wiring substrate 100 is used has the electrodes (E2a) on a surface facing the wiring substrate 100 side. The component (E2) can be an electronic component such as a semiconductor device that generates an electrical signal that causes the component (E1) to emit light, and/or processes an electrical signal generated by the component (E1). Examples of the component (E2) include semiconductor devices such as a general-purpose operational amplifier, a driver IC, a microcomputer, and a programmable logic device (PLD).

The core part 51 of the optical waveguide 5 extends mainly along the optical waveguide 5 from one end side to the other end side. The core part 51 has an end surface (5a) (first end surface) on one end side, and an end surface (5b) (second end surface) that is an end surface on the other end side on the opposite side with respect to the end surface (5a) and on which light is incident and from which light is emitted. The end surface (5a) and the end surface (5b) are surfaces of the core part 51 that intersect a first direction (X) along the surface (21a) of the insulating layer 21. An optical connector (C) is mounted on the wiring substrate 100 of FIG. 1. The optical connector (C) and the optical waveguide 5 are positioned such that a light receiving and emitting part of the optical connector (C) and the end surface (5b) of the core part 51 are optically coupled.

The core part 51 further has a side surface (5c) along the first direction (X). The side surface (5c) is covered by the clad part 52 that surrounds the core part 51. However, the side surface (5c) also has an exposed portion (5ca) (first exposed portion) that is not covered by the clad part 52. The clad part 52 covers a portion (5cb) other than the exposed portion (5ca) of the side surface (5c) of the core part 51. That is, the side surface (5c) has the portion (the portion (5cb) other than the exposed portion (5ca)) covered by the clad part 52 and the exposed portion (5ca). Further, the optical waveguide 5 is positioned at a position where the light receiving or light emitting part (E1b) of the component (E1) and the exposed portion (5ca) of the side surface (5c) of the core part 51 are optically coupled when the component (E1) is mounted in the component region (A1).

Examples of a method for forming the optical waveguide 5 having the core part 51 as in the example of FIGS. 1-3 include a Mosquito method, in which a needle is caused to scan in a clad while a material for forming the core part is discharged, an imprint method, and the like. For example, in forming the optical waveguide 5 using a Mosquito method, an imprint method, or the like, a portion of the clad part 52 that is formed so as to cover the exposed portion (5ca) is removed by exposure and development or mechanical processing before complete curing by post-baking or the like. The exposed portion (5ca) may be provided in this way.

The core part 51 can have any shape for the end surfaces and cross sections orthogonal to the first direction (X). For example, the core part 51 may have a circular shape or any polygonal shape such as a rectangular shape for the end surfaces and cross sections orthogonal to the first direction (X). Therefore, the side surface (5c) of the core part 51 may be a flat surface, a curved surface, or may include a bent portion. The exposed portion (5ca), which is a portion of the side surface (5c), and the portion (5cb) other than the exposed portion (5ca) also may each be a flat surface or a curved surface, and include a bent portion. Further, the exposed portion (5ca) including a curved surface portion and/or a bent portion may be flattened by processing such as polishing.

As illustrated in FIG. 1, an optical fiber (F) can be connected to the optical connector (C) when the wiring substrate 100 is used. As illustrated in FIGS. 1 and 2, light propagating through the optical fiber (F) is incident on the end surface (5b) of the core part 51 via the optical connector (C) and propagates in the core part 51 toward the end surface (5a). A part of the light leaks from the side surface (5c) to outside of the core part 51 as evanescent light. The light leaked from the core part 51 in the exposed portion (5ca) of the side surface (5c) is incident on the light receiving or light emitting part (E1b) of the component (E1). That is, when the wiring substrate 100 is used, the exposed portion (5ca) of the side surface (5c) of the core part 51 and the light receiving or light emitting part (E1b) of the component (E1) are adiabatically coupled. Light (evanescent light) incident on the light receiving or light emitting part (E1b) is converted into an electrical signal by the component (E1), and the electrical signal is output from electrodes (E1a), input to the component (E2), and processed by the component (E2). Conversely, an electrical signal output from the component (E2) is input to the component (E1) by a reverse path and is converted into light. The light is emitted from the light receiving or light emitting part (E1b) of the component (E1), is incident on the core part 51 from the exposed portion (5ca) of the side surface (5c), propagates in the core part 51 and is emitted from the end surface (5b). Then, the emitted light is incident on the optical fiber (F) and propagates to the outside.

In the example of FIGS. 1-3, as illustrated in FIG. 2, the optical waveguide 5 has two parallel core parts 51. In this way, the optical waveguide 5 provided in the wiring substrate of the embodiment can have multiple core parts 51. Further, as illustrated in FIG. 2, the multiple wirings (11e) are provided. The multiple conductor pads (11a) and the multiple conductor pads (11b) are connected by multiple parallel wirings (11e). In the present embodiment, the conductor posts 61 are respectively formed on the conductor pads (11a), and the conductor posts 62 are respectively formed on the conductor pads (11b). Therefore, it is thought that a short-circuit failure is unlikely to occur between adjacent conductor pads (11a) and between adjacent conductor pads (11b). Therefore, it may be possible that the multiple wirings (11e) are formed, for example, at a narrow pitch such as 10 μm or less.

In the present embodiment, as illustrated in FIGS. 1 and 3, the exposed portion (5ca) of the side surface (5c) of the core part 51 of the optical waveguide 5 faces the opposite direction with respect to the insulating layer 21 in the component region (A1), that is, faces the component (E1) when the wiring substrate 100 is used, and is exposed from the optical waveguide 5. There is no clad part 52 that covers the exposed portion (5ca) of the core part 51. An end surface of the clad part 52 that is on the opposite side with respect to the insulating layer 21 and is on the exposed portion (5ca) side of the core part 51 recedes to the end surface (5b) side so that the exposed portion (5ca) is exposed.

Then, as illustrated in FIG. 3, a distance (D1) between the exposed portion (5ca) of the side surface (5c) of the core part 51 and the surface (21a) of the insulating layer 21 is larger than a thickness (T) of the covering layer 41. As described above, the exposed portion (5ca) of the side surface (5c) may be a flat surface or a curved surface, and may include a bent portion. When the exposed portion (5ca) is curved surface or includes a bent portion, the distance (D1) between the exposed portion (5ca) and the surface (21a) of the insulating layer 21 is larger than the thickness (T) of the covering layer 41 at least at a point where the distance (D1) is the longest. Further, the thickness (T) of the covering layer 41 is not a thickness of a portion of the covering layer 41 covering the conductor layer 11, but is a thickness of a portion in contact with the surface (21a) of the insulating layer 21. That is, the thickness (T) of the covering layer 41 is a distance between the surface (21a) of the insulating layer 21 and a surface (upper surface) of the covering layer 41 on the opposite side with respect to the insulating layer 21.

In the present embodiment, in this way, the exposed portion (5ca) of the side surface (5c) of the core part 51 of the optical waveguide 5 faces the opposite direction with respect to the insulating layer 21 in the component region (A1) so as to face the component (E1) when the wiring substrate 100 is used, and is exposed from the clad part 52. As described above, the optical waveguide 5 is provided in a region of the surface (21a) of the insulating layer 21 that is not covered by the covering layer 41. Then, the distance (D1) between the exposed portion (5ca) of the core part 51 and the surface (21a) of the insulating layer 21 is larger than the distance between the surface (21a) of the insulating layer 21 and the upper surface of the covering layer 41 (the thickness (T) of the covering layer 41) at least at a point where the distance (D1) is the longest. Therefore, it may be possible that the light receiving or light emitting part (E1b) of the component (E1) positioned at least partially on the covering layer 41 and the exposed portion (5ca) of the core part 51 can be brought close to each other. Further, the core part 51 can face the light receiving or light emitting part (E1b) of the component (E1) without intervention of the clad part 52 when the wiring substrate 100 is used.

Therefore, it is thought that the core part 51 of the optical waveguide 5 and the light receiving or light emitting part (E1b) of the component (E1) can be optically coupled with a high coupling efficiency. It is thought that light can propagate between the optical waveguide 5 and the component (E1) with less loss.

Furthermore, in the present embodiment, the conductor posts 61 penetrating the covering layer 41 are formed on the conductor pads (11a). Therefore, a distance between conductors that are to be physically connected for electrical connection between the electrodes (E1a) of the component (E1), which is mounted above the optical waveguide 5 (on the opposite side with respect to the insulating layer 21), and the conductor pads (11a) (an insulation distance between the electrodes (E1a) and the conductor pads (11a)) can be shortened. That is, the insulation distance between the electrodes (E1a) and the conductor pads (11a) can be shortened as compared to a case where the conductor posts 61 are not formed. Therefore, it is thought that connection reliability between the component (E1) and the wiring substrate 100 is improved.

In particular, in the examples of FIGS. 1-3, the conductor posts 61 protrude from the surface of the covering layer 41 on the opposite side with respect to the insulating layer 21. Therefore, the insulation distance between the electrodes (E1a) and the conductor pads (11a) can be further shortened, and the connection reliability between the component (E1) and the wiring substrate 100 may be further improved.

Further, when solder bumps or the like are used for mounting the component (E1) on the wiring substrate 100, since the conductor posts 61 are provided, it is thought that small solder bumps, that is, solder bumps with low heights and narrow widths can be used. Therefore, it may be possible that the conductor pads (11a) are formed closer to each other as compared to the case where the conductor posts 61 are not formed. Therefore, it may be possible that a component (E1) having multiple electrodes (E1a) positioned at a narrower pitch can be mounted. Further, it may be possible that the wirings (11e) (see FIGS. 1 and 2) are formed at a narrow pitch. Further, since a change in impedance due to bumps is smaller as compared to a case where large bumps are used, it may be possible that better high frequency transmission characteristics can be obtained.

In this way, according to the present embodiment, it may be possible that the core part of the optical waveguide, which is provided on the surface of the insulating layer having the conductor pads, and a component connected to the conductor pads can be optically coupled with a high coupling efficiency, and the component and the conductor pads can be electrically connected with good connection quality. Further, it may be possible that it can contribute to realization of densification and good high frequency characteristics of the wiring substrate.

With reference to FIG. 3, the optical waveguide 5 and the conductor posts 61 are further described. The description with respect to the conductor posts 61 can also be applied to the conductor posts 62. As illustrated in FIG. 3, the core part 51 of the optical waveguide 5 has the end surface (5a), which intersects the first direction (X) along the surface (21a) of the insulating layer 21, inside the optical waveguide 5 in the component region (A1) (first component region). That is, the end surface (5a) of the core part 51 is not exposed from the optical waveguide 5. The core part 51 is in contact with the clad part 52 at the end surface (5a) without penetrating the optical waveguide 5 in the first direction (X).

And, the end surface (5a) is inclined with respect to a virtual orthogonal plane (not illustrated in the drawings) with respect to the first direction (X) so as to face the insulating layer 21 side. In other words, a contact surface (5d) of the clad part 52 in contact with the end surface (5a) of the core part 51 is inclined with respect to the virtual orthogonal plane with respect to the first direction (X) so as to face the opposite direction with respect to the insulating layer 21, that is, to face the component (E1) when the wiring substrate 100 is used. Therefore, it is thought that, as compared to a case where the end surface (5a) is orthogonal to the first direction (X), light propagating from the end surface (5b) (see FIG. 1) is easily reflected toward the exposed portion (5ca) of the side surface (5c) by the end surface (5a). Similarly, it is thought that light received from the exposed portion (5ca) and incident on an interface with the clad part 52 at the end surface (5a) is easily reflected toward the end surface (5b) (see FIG. 1). In the example of FIG. 3, the end surface (5a) is inclined at an angle of substantially 45 degrees with respect to the surface (21a) of the insulating layer 21. It is thought that light incident on the core part 51 efficiently propagates toward the end surface (5b) or the exposed part (5ca).

A length (L) of the exposed portion (5ca) in the first direction (X) is, for example, 100 μm or more and 500 μm or less. Or, an area of the exposed portion (5ca) of the core part 51 is 100 μm2 or more and 5000 μm2 or less. It is thought that a sufficient amount of light is likely to be received or emitted regarding an exchange of an optical signal with the component (E1). Further, it may be possible that an unnecessary increase in size of the of wiring substrate 100 is avoided.

In the example of FIG. 3, the exposed portion (5ca) is a flat surface substantially parallel to the surface (21a) of the insulating layer 21. It is thought that the component (E1) is mounted such that a light receiving or light emitting surface (E1c) of the light receiving or light emitting part (E1b) is substantially parallel to the surface (21a) of the insulating layer 21. Therefore, the exposed portion (5ca), which is a flat surface substantially parallel to the surface (21a) of the insulating layer 21, can face the light receiving or light emitting surface (E1c) of the component (E1) in a substantially mutually parallel state. Therefore, it is thought that the core part 51 and the component (E1) are optically coupled with a high coupling efficiency as compared to a case where the exposed portion (5ca) is inclined with respect to the surface (21a) of the insulating layer 21.

Further, in the example of FIGS. 1-3, each of the conductor posts 61 has an end surface (61a) facing substantially the same direction as the exposed portion (5ca) at an end part on the opposite side with respect to the conductor pads (11a) side. In other words, the end surface (61a) of each of the conductor posts 61 and the exposed portion (5ca) of the core part 51 are substantially parallel to each other, and therefore, the end surface (61a) is substantially parallel to the surface (21a) of the insulating layer 21. It is thought that the electrodes (E1a) and the light receiving or light emitting part (E1b) of the component (E1) are formed such that a connection surface (E1d) of each of the electrodes (E1a) and the light receiving or light emitting surface (E1c) of the light receiving or light emitting part (E1b) are substantially parallel to each other. Further, it is thought that the component (E1) is mounted such that the connection surface (E1d) of each of the electrodes (E1a) is substantially parallel to the surface (21a) of the insulating layer 21. Since each of the conductor posts 61 has the end surface (61a) that is substantially parallel to the exposed portion (5ca) of the core part 51, it is thought that the core part 51 and the component (E1) are optically coupled with a high coupling efficiency, and the component (E1) and the conductor posts 61 are stably connected.

Each of the conductor posts 61 in the example of FIG. 3 has a substantially constant width from the conductor pads (11a) side to the opposite side with respect to the conductor pads (11a) side, that is, to the side facing the component (E1) when the wiring substrate 100 is used. Further, each of the conductor posts 61 is integrally formed. That is, in the example of FIG. 3, each of the conductor posts 61 is entirely integrally formed. For example, an interface between different materials or an interface between regions with different formation times is not included in each of the conductor posts 61. In this way, it is thought that, in the conductor posts 61, each of which is entirely integrally formed with a substantially constant width, a crack or interface peeling due to stress concentration is unlikely to occur.

As illustrated in FIGS. 1 and 3, the wiring substrate 100 of FIGS. 1-3 further includes a connection layer 7. The connection layer 7 is formed on the end surfaces (61a) of the conductor posts 61. The connection layer 7 is formed of a material having a lower melting point than the conductor posts 61. Therefore, the connection layer 7 can contribute to the connection between conductor posts 61 (or the conductor posts 62) and the component (E1) (or the component (E2)). Examples of the material of the connection layer 7 include tin-based solder, gold-based solder, and the like. In the wiring substrate 100 including the connection layer 7, when the component (E1) or the component (E2) is mounted, it may be possible that supply of a bonding material such as solder can be omitted.

In the example of FIG. 3, a distance (D2) between the end surface (61a) of each of the conductor posts 61 and the surface (21a) of the insulating layer 21 is shorter than the distance (D1) between the exposed portion (5ca) of the core part 51 and the surface (21a) of the insulating layer 21. Therefore, it is thought that proximity between the exposed surface (5ca) of the core part 51 and the light receiving or light emitting part (E1b) of the component (E1) is unlikely to be hindered by the contact between the conductor posts 61 and the electrodes (E1a) of the component (E1). Therefore, it is thought that a good coupling efficiency in optical coupling between the optical waveguide 5 and the component (E1) can be stably and easily obtained.

On the other hand, a distance (D3) between at least a part of a surface of the connection layer 7 on the opposite side with respect to the conductor posts 61 and the surface (21a) of the insulating layer 21 is longer than the distance (D1) between the exposed portion (5ca) of the core part 51 and the surface (21a) of the insulating layer 21. Specifically, at least at an uppermost part of the surface of the connection layer 7 (a portion most distant from the surface (21a) of the insulating layer 21), the distance (D3) is longer than the distance (D1). That is, at least a part of the connection layer 7 protrudes from the exposed portion (5ca) of the core part 51 to the opposite side with respect the insulating layer 21, that is, to the component (E1) side when the wiring substrate 100 is used. Therefore, it is thought that, when the component (E1) is mounted on the wiring substrate 100, the connection layer 7 and the electrodes (E1a) of the component (E1) can be easily brought into contact with each other, and therefore, the conductor posts 61 and the electrodes (E1a) can be substantially reliably connected. The connection layer 7 can melt when the component (E1) is mounted, and thus, is unlikely to hinder the proximity between the exposed portion (5ca) of the core part 51 and the light receiving or light emitting part (E1b) of the component (E1).

Figure 4:
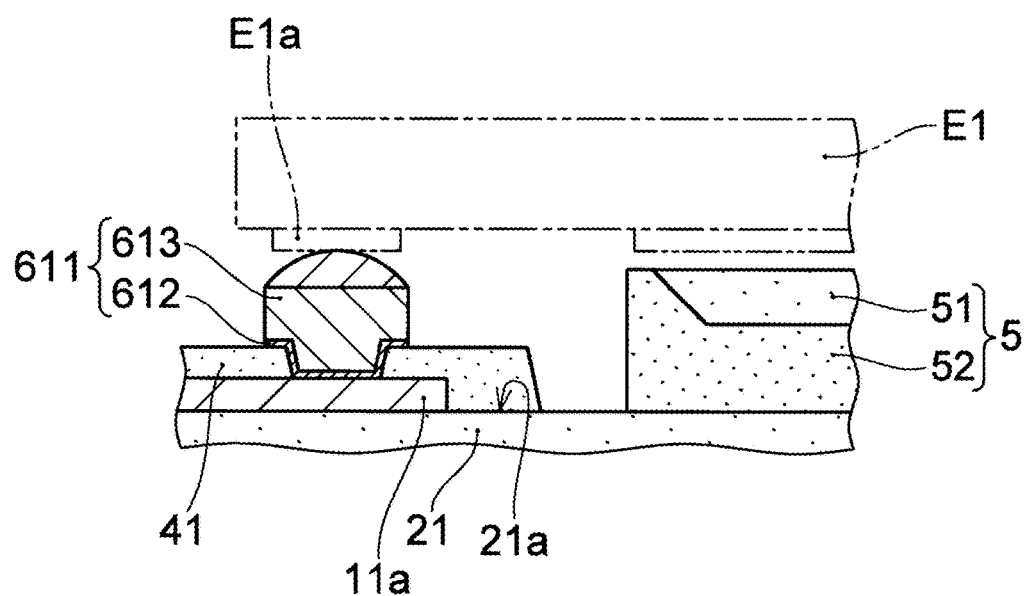
FIG. 4 is an enlarged view illustrating a modified embodiment of a conductor post in the embodiment of the present invention.

FIG. 4 illustrates conductor posts 611, which are a modified embodiment of the conductor posts 61 of FIGS. 1-3. As illustrated in FIG. 4, each of the conductor posts 611 has a two-layer structure including a lower layer 612 and an upper layer 613. The lower layer 612 is, for example, a metal film formed by electroless plating or sputtering. The upper layer 613 is, for example, an electrolytic plating film formed by electrolytic plating using the lower layer 612 as a power feeding layer. Each of the conductor posts 611 has in the covering film 41 a tapered portion that tapers toward a conductor pad (11a). Therefore, in the example of FIG. 4 having the conductor posts 611, it may be possible that the conductor posts 611 can be connected to the electrodes (E1a) of the component (E1) with areas larger than areas of the conductor pads (11a). Further, as will be described later, it is thought that the conductor posts 611 can be formed in fewer processes than the conductor posts 61 in the example of FIGS. 1-3.

Figure 5:
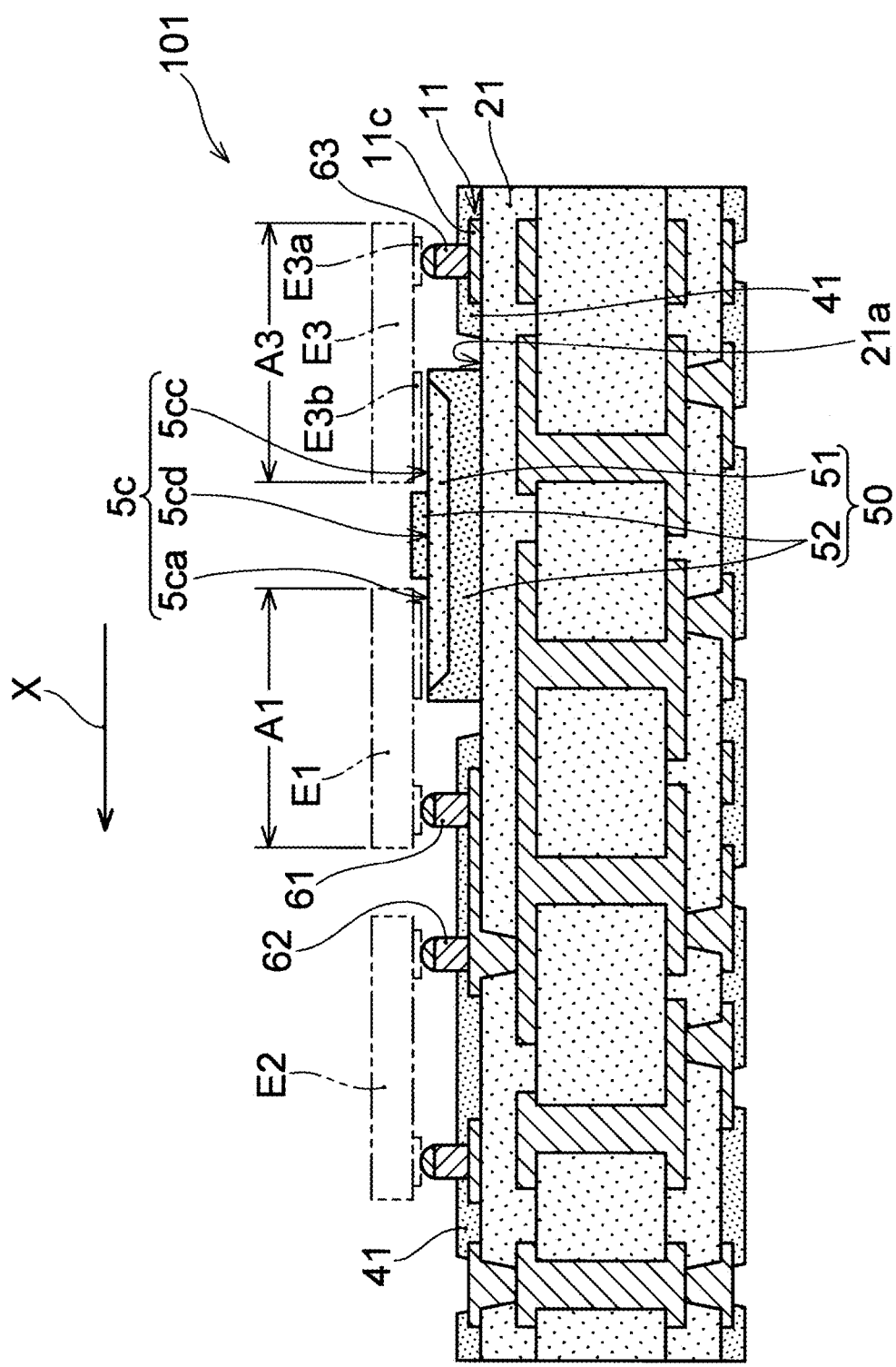
FIG. 5 is a cross-sectional view illustrating an example of a wiring substrate according to another embodiment of the present invention.

FIG. 5 illustrates a wiring substrate 101, which is an example of a wiring substrate of another embodiment. Except for items described below, the wiring substrate 101 is formed of the same structural elements as the wiring substrate 100 illustrated in FIG. 1 and the like, and has the same structure as the wiring substrate 100. A structural element that is the same as a structural element of the wiring substrate 100 is indicated in FIG. 5 using the same reference numeral symbol as in FIG. 1, or is omitted as appropriate in FIG. 5, and repeated description thereof is omitted.

As illustrated in FIG. 5, instead of the optical waveguide 5 provided in the wiring substrate 100 of FIG. 1, the wiring substrate 101 includes an optical waveguide 50 of which the side surface (5c) of the core part 51 has an exposed portion (5cc) (second exposed portion) in addition to the exposed portion (5ca). The core part 51 of the optical waveguide 50 has the exposed portion (5ca) on one end side and the exposed portion (5cc) on the other end side in the first direction (X). Further, in the wiring substrate 101, the conductor layer 11 includes conductor pads (11c) (third conductor pads). That is, the third conductor pads (11c) are further provided on the surface (21a) of the insulating layer 21. The conductor posts 63 are respectively formed on the conductor pads (11c), and the conductor posts 63 are respectively connected to the conductor pads (11c). Similar to the conductor posts (61, 62), each of the conductor posts 63 is a conductor having a columnar, frustum-like, or inverted frustum-like shape extending from the conductor layer 11 in the opposite direction with respect to the insulating layer 21. The conductor posts 63 protrude from upper surfaces of the conductor pads (11c) and penetrate the covering layer 41.

As illustrated in FIG. 5, when the wiring substrate 101 is used, an external component (E3) is connected to the conductor posts 63. Specifically, electrodes (E3a) of the component (E3) and the conductor posts 63 are connected. Therefore, the component (E3) is electrically connected to the conductor pads (11c) via the conductor posts 63. Further, the wiring substrate 101 includes a component region (A3) (third component region), which is a region to be covered by the component (E3) when the wiring substrate 101 is used. The component (E3) is positioned in the component region (A3). The component (E3) is mounted on the opposite side of the conductor posts 63 and the optical waveguide 50 with respect to the insulating layer 21 side.

Similar to the component (E1), the component (E3) is an electrical component that includes a light receiving element and/or a light emitting element and has a photoelectric conversion function, and the light receiving element or the light emitting element described above regarding the component (E1) is mounted on the wiring substrate 101 as the component (E3). Therefore, the component (E3) includes a light receiving or light emitting part (E3b) in addition to the electrodes (E3a). The electrodes (E3a) and the light receiving or light emitting part (E3b) are provided on a surface of the component (E3) facing the wiring substrate 101 side.

Similar to the optical waveguide 5 in the example of FIG. 1, the optical waveguide 50 is provided in a region of the surface (21a) of the insulating layer 21 that is not covered by the covering layer 41, and includes a core part 51 and a clad part 52. The core part 51 and the clad part 52 of the optical waveguide 50 can be formed of an organic or inorganic material, or a mixed material thereof as described above regarding the material of the core part 51 and the clad part 52 of the optical waveguide 5.

Similar to the optical waveguide 5 of FIG. 1, the side surface (5c) along the first direction (X) of the core part 51 of the optical waveguide 50 has, on one end side in the first direction (X), the exposed portion (5ca) that faces the opposite direction with respect to the insulating layer 21 and is exposed from the optical waveguide 50 in the component region (A1). And, the side surface (5c) of the core part 51 of the optical waveguide 50 has the exposed portion (5cc) on the other end side on the opposite side with respect to the one end side of the core part 51 that includes the exposed portion (5ca). That is, the side surface (5c) has the exposed portion (5ca) and the exposed portion (5cc), and a portion (5cd) that is sandwiched by the exposed portion (5ca) and the exposed portion (5cc) and is covered by the clad part 52. The exposed portion (5cc) faces the opposite direction with respect to the insulating layer 21 and is exposed from the optical waveguide 50 in the component region (A3) on the opposite side with respect to the exposed portion (5ca) side in the first direction (X).

That is, the exposed portion (5cc) is exposed from the optical waveguide 50 so as to face the component (E3) when the wiring substrate 101 is used. The exposed portion (5cc) is positioned so as to face the light receiving or light emitting part (E3b) of the component (E3) when the wiring substrate is used. Also in the wiring substrate 101, the distance between the exposed portion (5ca) of the core part 51 of the optical waveguide 50 and the surface (21a) of the insulating layer 21 is larger than the thickness of the covering layer 41. The exposed portion (5cc) on the other end side of the core part 51 is preferably substantially flush with the exposed portion (5ca) on the one end side. Therefore, a distance between the exposed portion (5cc) and the surface (21a) of the insulating layer 21 can be larger than the thickness of the covering layer 41. It may be possible that the exposed portion (5cc) of the core part 51 of the optical waveguide 50 and the light receiving or light emitting part (E3b) of the component (E3) can be optically coupled with a high coupling efficiency. It is also possible that the exposed portion (5cc) on the other end side of the core part 51 and the exposed portion (5ca) on the one end side are not flush with each other. Even in that case, the distance between the exposed portion (5cc) and the surface (21a) of the insulating layer 21 may be larger than the thickness of the covering layer 41.

Further, since the conductor posts 63 that penetrate the covering layer 41 and protrude from the surface of the covering layer 41 are formed on the conductor pads (11c), it may be possible that connection reliability between the component (E3) and the wiring substrate 101 is increased. Further, it may be possible that densification and good high frequency characteristics of the wiring substrate are realized.

Next, a method for manufacturing the wiring substrate of the embodiment is described with reference to FIGS. 6A-6H using the wiring substrate 100 of FIG. 1 as an example.

Figure 6A:
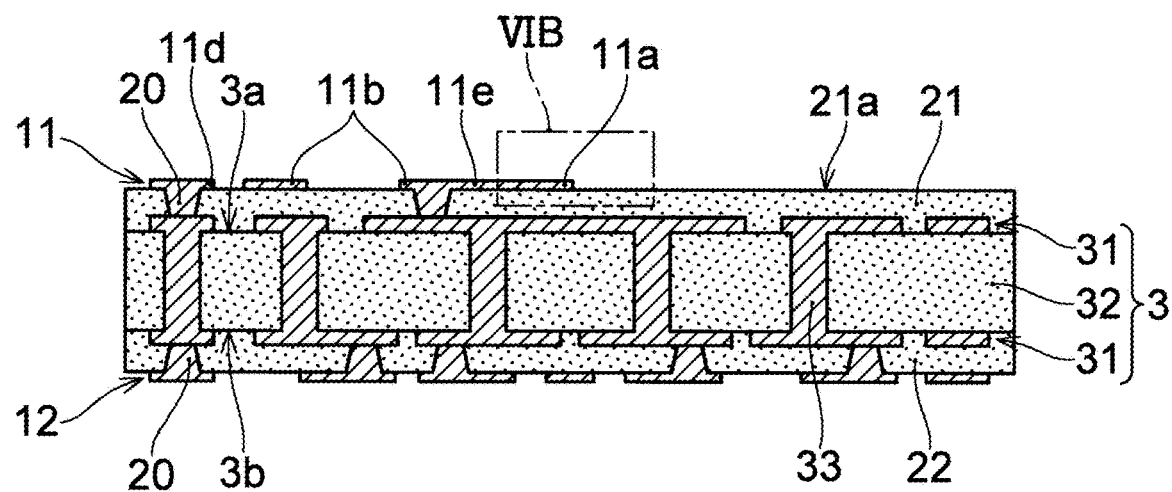
FIG. 6A is a cross-sectional view illustrating an example of a manufacturing process of a wiring according to an embodiment of the present invention.

As illustrated in FIG. 6A, the insulating layers (21, 22) and the conductor layers (11, 12) are formed on both sides of the core substrate 3. For example, the conductor layers 31, which have desired conductor patterns, and the through-hole conductors 33 are formed using a subtractive method on or in a double-sided copper-clad laminated substrate including an insulating layer that is to become the insulating layer 32 of the core substrate 3. Then, the insulating layer 21 is formed on the first surface (3a) of the core substrate 3, and the insulating layer 22 is formed on the second surface (3b) of the core substrate 3. Each of the insulating layer 21 and the insulating layer 22 is formed, for example, by laminating and thermocompression bonding a film-like epoxy resin on the core substrate 3. Through holes for forming the via conductors 20 are formed in the insulating layers, for example, by irradiation with $CO_2$ laser or the like. Then, the conductor layer 11 is formed on the surface (21a) of the insulating layer 21, and the conductor layer 12 is formed on the insulating layer 22. The conductor layer 11 is formed to include the conductor pads (11a, 11b, 11d) and the wirings (11e). Each of the conductor layer 11 and the conductor layer 12 is formed using, for example, a semi-additive method.

Figure 6B:
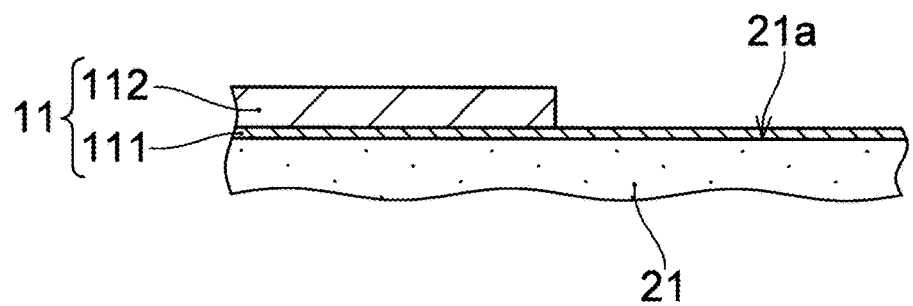
FIG. 6B is a cross-sectional view illustrating an example of a manufacturing process of a wiring substrate according to an embodiment of the present invention.

FIG. 6B illustrates an enlarged view of a portion (VIB) of FIG. 6A. In the formation of the conductor layer 11 and the like using a semi-additive method, as illustrated in FIG. 6B, for example, a metal film 111 is formed on the surface (21a) of the insulating layer 21 by electroless plating or sputtering. A plating film 112 is formed by pattern plating including electrolytic plating using the metal film 111 as a power feeding layer.

Figure 6C:
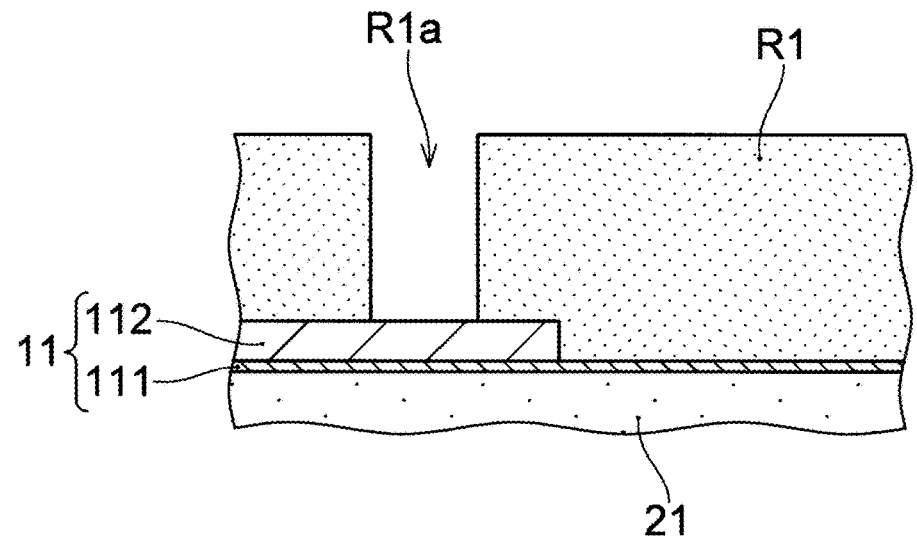
FIG. 6C is a cross-sectional view illustrating an example of a manufacturing process of a wiring substrate according to an embodiment of the present invention.
Figure 6D:
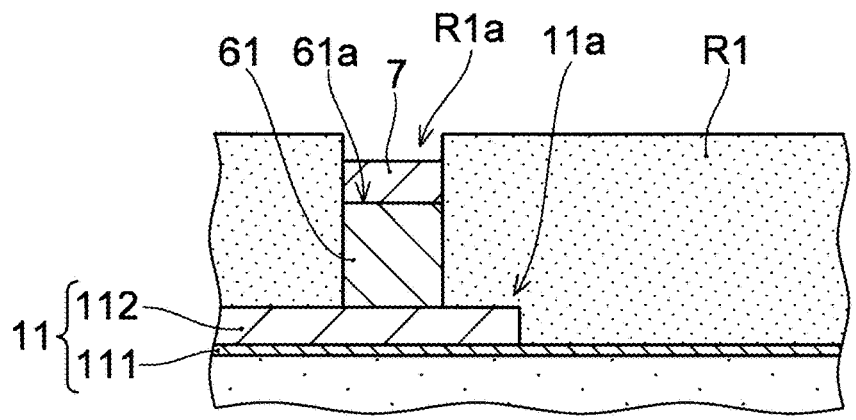
FIG. 6D is a cross-sectional view illustrating an example of a manufacturing process of a wiring substrate according to an embodiment of the present invention.
Figure 6E:
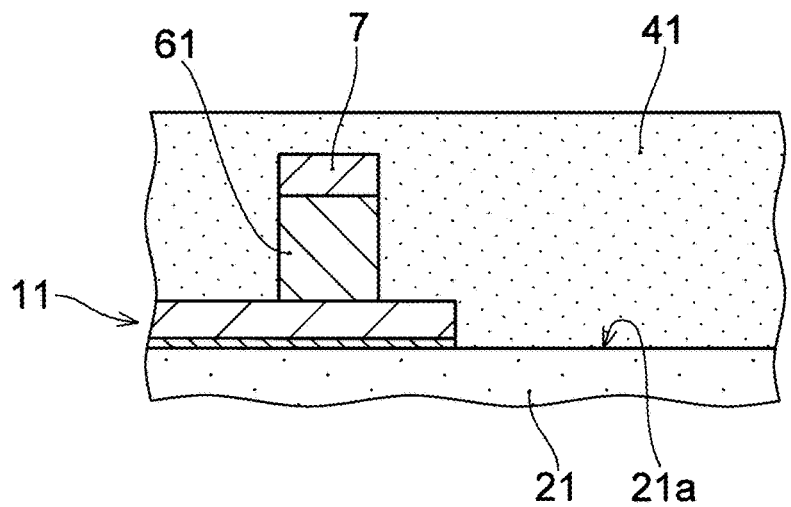
FIG. 6E is a cross-sectional view illustrating an example of a manufacturing process of a wiring substrate according to an embodiment of the present invention.

In a case where the wiring substrate 100 of FIG. 1 is manufactured, after the formation of the plating film 112 by pattern plating, a plating resist (not illustrated in the drawings) used for the pattern plating is removed, and then, the conductor posts (61, 62) (see FIG. 1) are formed with the metal film 111 entirely remaining. Using the conductor posts 61 as an example, a method for forming the conductor posts (61, 62) is described below with reference to FIGS. 6C-6E. FIGS. 6C-6E illustrate the same portion as the portion illustrated in FIG. 6B.

As illustrated in FIG. 6C, on the conductor layer 11 and the insulating layer 21, a platting resist (R1) having openings (R1a) at formation sites of the conductor posts 61 is formed. For example, the plating resist (R1) contains a photosensitive resin and the openings (R1a) are formed by exposure and development.

As illustrated in FIG. 6D, in the openings (R1a), for example, the conductor posts 61 are respectively formed by electrolytic plating using the metal film 111 as a power feeding layer. The conductor posts 61 are formed so as to have a height allowing the conductor posts 61 to penetrate the covering layer 41 when the formation of the covering layer 41 is completed in a subsequent process (see FIG. 6G), preferably, a height allowing the conductor posts 61 to protrude from the upper surface of the covering layer 41.

Further, as illustrated in FIG. 6D, the connection layer 7 is formed on the end surfaces (61a) of the conductor posts 61. As the connection layer 7, for example, a metal film formed of tin, a tin alloy, a gold alloy, or the like is formed. The connection layer 7 can be formed by electrolytic plating using the metal film 111 as a power feeding layer. After the formation of the connection layer 7, the plating resist (R1) is removed using a suitable peeling agent. Then, a portion of the metal film 111 that is exposed by the removal of the plating resist (R1), that is, a portion that is not covered by the plating film 112 is removed by, for example, quick etching. The conductor patterns of the conductor layer 11, such as the conductor pads (11a), are physically and electrically separated from other conductor patterns.

Figure 6F:
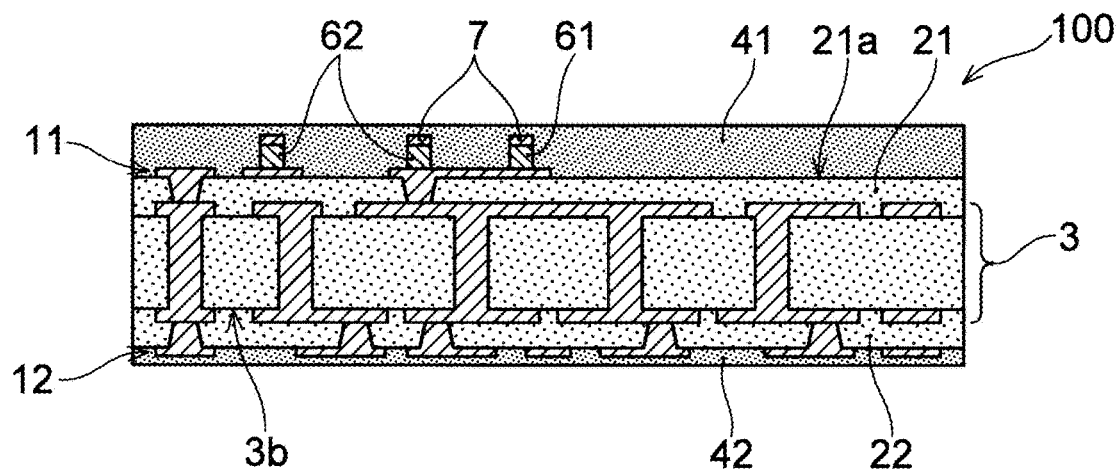
FIG. 6F is a cross-sectional view illustrating an example of a manufacturing process of a wiring substrate according to an embodiment of the present invention.

As illustrated in FIGS. 6E and 6F, the covering layer 41 covering the insulating layer 21 and the conductor layer 11, the conductor posts (61, 62), and the connection layer 7 is formed. Similar to FIG. 6E, FIG. 6F illustrates a state of the entire wiring substrate 100 after the formation of the covering layer 41. At the stage illustrated in FIGS. 6E and 6F, the covering layer 41 is formed so as to cover all the structural elements on the surface (21a) of the insulating layer 21, including the conductor posts (61, 62) and the connection layer 7.

The covering layer 41 is formed, for example, by supplying a liquid or sheet-like epoxy resin or polyimide resin or the like onto the surface (21a) of the insulating layer 21 and onto the structural elements on the surface (21a) using a method such as printing, coating, spraying, or laminating. It is also possible that the covering layer 41 is formed by injection molding using an appropriate mold. Further, it is also possible that a photosensitive epoxy resin or polyimide resin may be used. When necessary, the covering layer 41 is fully cured or temporarily cured by heating, UV irradiation, or the like. As illustrated in FIG. 6F, on the second surface (3b) side of the core substrate 3, the solder resist 42 is formed by coating or laminating an epoxy resin or polyimide resin, and the conductor layer 12 and the insulating layer 22 are entirely covered by the solder resist 42.

Figure 6G:
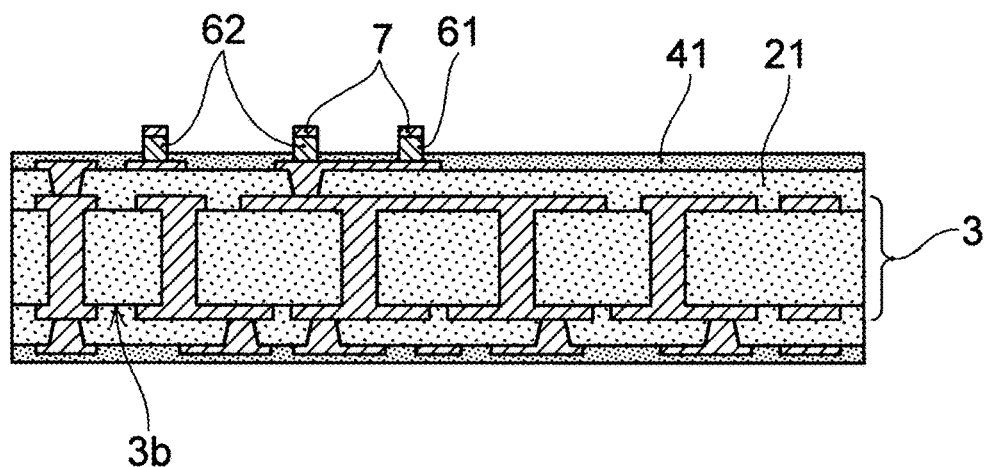
FIG. 6G is a cross-sectional view illustrating an example of a manufacturing process of a wiring substrate according to an embodiment of the present invention.

As illustrated in FIG. 6G, a portion of the covering layer 41 in the thickness direction is removed such that the end parts of the conductor posts (61, 62) on the opposite side with respect to the insulating layer 21 are exposed together with the connection layer 7 from the covering layer 41. Specifically, a portion of the covering layer 41 having a predetermined thickness from a surface of the covering layer 41 on the opposite side with respect to the insulating layer 21 is completely removed. Due to the reduction in the thickness of the covering layer 41, the end parts of the conductor posts (61, 62) on the opposite side with respect to the insulating layer 21 are exposed from the covering layer 41.

A portion of the covering layer 41 in the thickness direction can be removed, for example, by dry etching such as plasma etching using a carbon tetrafluoride (CF4) gas. Further, it is also possible that a portion of the covering layer 41 is removed by blasting. Although not illustrated in the drawings, surfaces on the second surface (3b) side of the core substrate 3 may be protected, for example, by applying a protective film such as a film formed of polyethylene terephthalate (PET) during the formation of the conductor posts (61, 62) and/or during the removal of a portion of the covering layer 41.

Figure 6H:
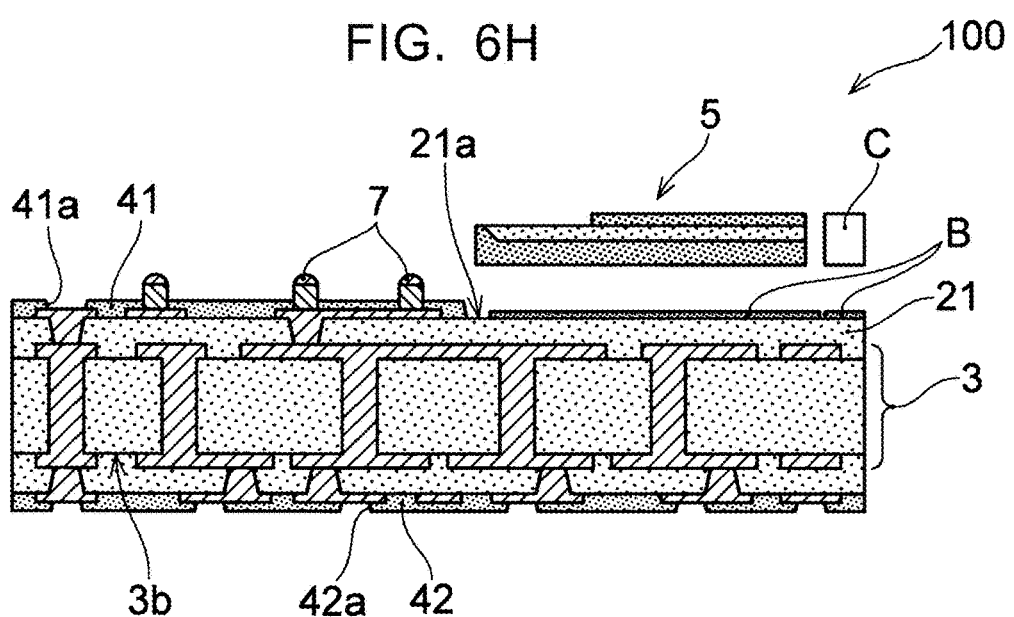
FIG. 6H is a cross-sectional view illustrating an example of a manufacturing process of a wiring substrate according to an embodiment of the present invention.

As illustrated in FIG. 6H, a portion of the covering layer 41 corresponding to a region where the optical waveguide 5 and the optical connector (C) are to be provided is removed by, for example, irradiation with $CO_2$ laser or the like. A region of the surface (21*a*) of the insulating layer 21 where the optical waveguide 5 and the optical connector (C) are provided is exposed. By the laser processing, the openings (41*a*) can be formed. Further, on the second surface (3*b*) side of the core substrate 3, the openings (42*a*) are formed in the solder resist 42 by exposure and development or by laser processing.

As described above, the optical waveguide 5 is formed by using, for example, a Mosquito method, an imprint method, or the like. Further, any suitable optical connector (C) according to an intended use of the wiring substrate 100 is prepared. For example, any adhesive (B), such as a thermosetting, room temperature curable, or photocurable adhesive, is supplied to a predetermined portion of the surface (21*a*) of the insulating layer 21 exposed from the covering layer 41, and the optical waveguide 5 and the optical connector (C) are positioned on the adhesive (H). When necessary, a curing treatment of the adhesive (B) by heating or the like is performed, and the optical waveguide 5 and the optical connector (C) are fixed. Further, the connection layer 7 is once melted by a reflow process or the like and is shaped into a hemispherical shape. Through the above processes, the wiring substrate 100 in the example of FIG. 1 is completed.

In a case where the conductor posts 611 of the modified embodiment illustrated in FIG. 4 referenced above are formed, from the state illustrated in FIGS. 6A and 6B, the exposed portion of the metal film 111 is removed by, for example, quick etching. That is, before the formation of the conductor posts 611, the conductor patterns of the conductor layer 11 such as the conductor pads (11*a*) are separated from other conductor patterns.

Figure 7A:
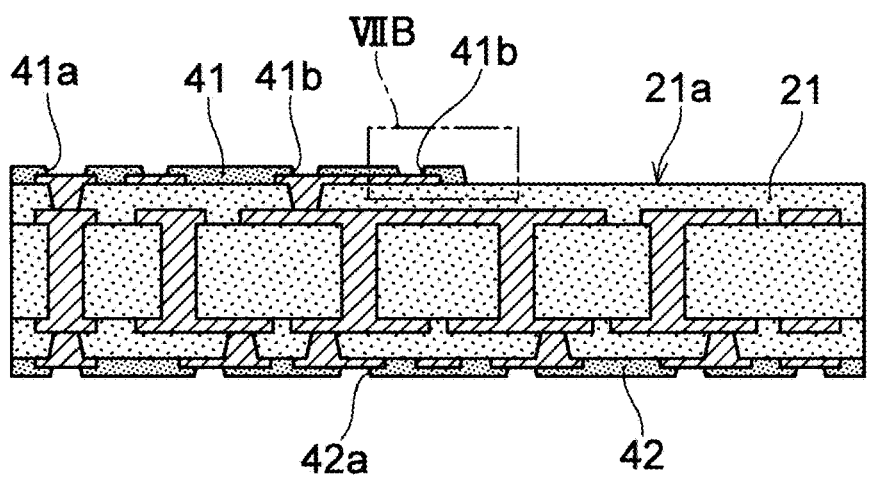
FIG. 7A is a cross-sectional view illustrating an example of a manufacturing process of the conductor post of the modified embodiment illustrated in FIG. 4.

Then, as illustrated in FIG. 7A, the covering layer 41 and the solder resist 42 are formed. The covering layer 41 and the solder resist 42 can be formed using the same methods as those described with reference to FIGS. 6E and 6F. Then, for example, by exposure and development, or laser processing, or the like, the openings (41*a*) and openings (41*b*) are formed in the covering layer 41, and a portion of the covering layer 41 corresponding to a region where the optical waveguide 5 and the optical connector (C) (see FIG. 1) are to be provided is removed. The openings (41*b*) are formed at positions where the conductor posts 611 are to be formed. Similarly, also in the solder resist 42, the openings (42*a*) are formed, for example, by exposure and development.

Figure 7B:
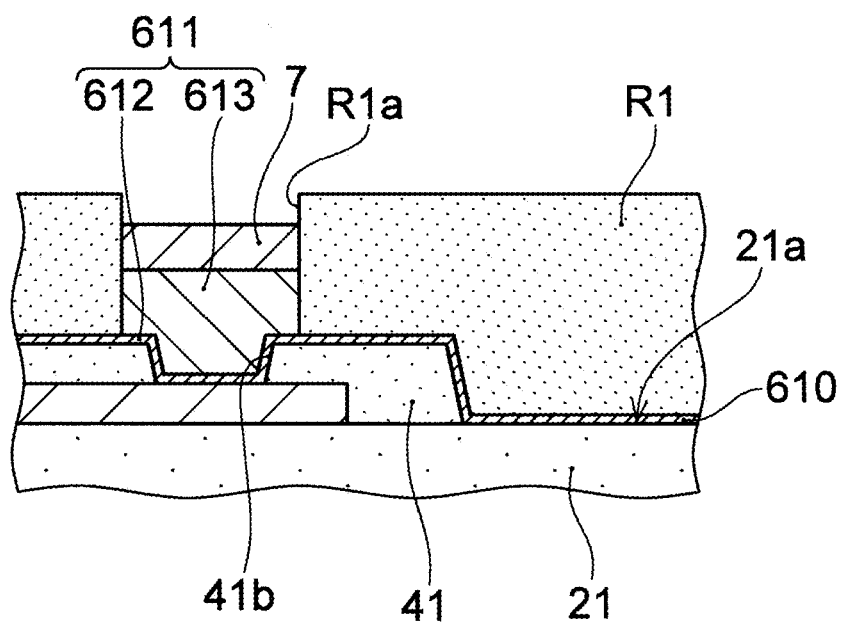
FIG. 7B is a cross-sectional view illustrating an example of a manufacturing process of the conductor post of the modified embodiment illustrated in FIG. 4.

Then, as illustrated in FIG. 7B, a metal film 610 forming the lower layer 612 of the conductor posts 611 is formed, for example, by electroless plating or sputtering. FIG. 7B illustrates an enlarged view of a portion corresponding to a portion (VIIB) of FIG. 7A. The metal film 610 is formed on the covering layer 41, on inner wall surfaces of the openings (41*b*), and on the surface (21*a*) of the insulating layer 21 that is not covered by the covering layer 41. Then, a plating resist (R1) having openings (R1*a*) exposing the openings (41*b*) at formation positions of the conductor posts 611 is formed. Although not illustrated in the drawings, the plating resist (R1) is formed so as to also cover the openings (41*a*) of the covering layer 41 (see FIG. 7A).

In the openings (R1*a*) and the openings (41*b*), a metal forming the upper layer 613 is deposited by electrolytic plating. The metal film 610 can be used as a power feeding layer. As a result, the conductor posts 611 each having a two-layer structure including the lower layer 612 and the upper layer 613 are formed. Further, by electrolytic plating using the metal film 610 as a power feeding layer, a metal film formed of tin, a tin alloy, a gold alloy, or the like is formed as the connection layer 7.

After that, the plating resist (R1) is removed, and the metal film 610 exposed by the removal of the plating resist (R1) is removed by quick etching or the like. Through the above processes, the conductor posts 611 in the example of FIG. 4 can be formed. In the method for forming the conductor posts 611 illustrated in FIGS. 7A and 7B, since it is not necessary to remove a portion of the covering layer 41 in the thickness direction, it may be possible that it is easier than forming the conductor posts 61 and the covering layer 41 in the example of FIG. 1.

The wiring substrate of the embodiment is not limited to those having the structures illustrated in the drawings and those having the structures, shapes, and materials exemplified herein. As described above, the wiring substrate of the embodiment can have any laminated structure. For example, the wiring substrate of the embodiment may be a coreless substrate that does not include a core substrate. The wiring substrate of the embodiment can include any number of conductor layers and any number of insulating layers. It is also possible that the optical connector (C) is not provided, and it is also possible that the conductor pads (11*b*) and the conductor posts 62 for mounting the component (E2) are not formed, and therefore, it is also possible that the component region (A2) is not included.

Japanese Patent Application Laid-Open Publication No. 2008-129385 describes an optical component mounting substrate on a surface of which an optical waveguide and an optical semiconductor element are mounted. The optical waveguide having a light receiving and emitting part on one end side and a light emitting part (or light receiving part) of the optical semiconductor element connected to a wiring pattern via a bump are optically coupled on the other end side of the optical waveguide. Light emitted by the optical semiconductor element is incident on a core part of the optical waveguide and propagates to the light receiving and emitting part, and, on the other hand, light incident on the light receiving and emitting part propagates through the core part and is incident on the optical semiconductor element from the other end side. The entire contents of this publication are incorporated herein by reference.

In the substrate described in Japanese Patent Application Laid-Open Publication No. 2008-129385, a clad layer of the optical waveguide is interposed between the core part on the other end side of the optical waveguide and the light emitting part (or the light receiving part) of the optical semiconductor element. That is, since a distance between the core part and the optical semiconductor element is large and, in addition, light propagates in any direction in the clad layer, it is thought that a high efficiency in optical coupling is unlikely to be obtained.

A wiring substrate according to an embodiment of the present invention includes: an insulating layer that has a surface having a first conductor pad; a covering layer that partially covers the insulating layer; an optical waveguide that is provided on the surface and includes a core part that transmits light; a conductor post that is formed of plating metal on the first conductor pad and penetrates the covering layer; and a first component region that is a region to be covered by a component connected to the conductor post. The core part has a side surface along a first direction along the surface of the insulating layer. The side surface has, in the first component region, an exposed portion that faces the opposite direction with respect to the insulating layer and is exposed from the optical waveguide. A distance between the exposed portion and the surface of the insulating layer is larger than a thickness of the covering layer.

According to an embodiment of the present invention, it may be possible that a coupling efficiency between the optical waveguide provided in the wiring substrate and a component optically coupled to the optical waveguide can be improved and connection reliability between the component and the wiring substrate can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
an insulating layer;
a conductor layer formed on a surface of the insulating layer and including a conductor pad;
a covering layer formed on the insulating layer such that the covering layer is covering a portion of the insulating layer;
an optical waveguide positioned on the surface of the insulating layer and comprising a core part configured to transmit light; and
a conductor post comprising plating metal and formed on the conductor pad of the conductor layer such that the conductor post is penetrating through the covering layer and configured to be connected to a component,
wherein the insulating layer has a component region covered by the component when the component is connected to the conductor post, the optical waveguide is formed such that the core part has a side surface extending in a direction along the surface of the insulating layer, that the side surface has an exposed portion exposed in the component region and facing an opposite direction with respect to the insulating layer, and that a distance between the exposed portion and the surface of the insulating layer is greater than a thickness of the covering layer.

2. The wiring substrate according to claim 1, wherein the optical waveguide includes a clad part sandwiching the core part such that the clad part is covering a portion of the core part other than the exposed portion of the side surface of the core part.

3. The wiring substrate according to claim 2, wherein the optical waveguide is formed such that a length of the exposed portion in the direction along the surface of the insulating layer is in a range of 100 μm to 500 μm.

4. The wiring substrate according to claim 2, wherein the optical waveguide is positioned in a region of the surface of the insulating layer that is not covered by the covering layer.

5. The wiring substrate according to claim 2, wherein the optical waveguide is formed such that the core part has an end surface intersecting the direction along the surface of the insulating layer inside the optical waveguide in the component region.

6. The wiring substrate according to claim 5, wherein the optical waveguide is formed such that the end surface is inclined with respect to an orthogonal plane of the direction along the surface of the insulating layer and facing the insulating layer.

7. The wiring substrate according to claim 2, wherein the conductor post has an end surface facing substantially a same direction as the exposed portion of the core part on an opposite side with respect to the conductor pad of the conductor layer.

8. The wiring substrate according to claim 1, wherein the optical waveguide is formed such that a length of the exposed portion in the direction along the surface of the insulating layer is in a range of 100 μm to 500 μm.

9. The wiring substrate according to claim 1, wherein the optical waveguide is positioned in a region of the surface of the insulating layer that is not covered by the covering layer.

10. The wiring substrate according to claim 1, wherein the optical waveguide is formed such that the core part has an end surface intersecting the direction along the surface of the insulating layer inside the optical waveguide in the component region.

11. The wiring substrate according to claim 10, wherein the optical waveguide is formed such that the end surface is inclined with respect to an orthogonal plane of the direction along the surface of the insulating layer and facing the insulating layer.

12. The wiring substrate according to claim 1, wherein the conductor post has an end surface facing substantially a same direction as the exposed portion of the core part on an opposite side with respect to the conductor pad of the conductor layer.

13. The wiring substrate according to claim 1, wherein the conductor layer includes a wiring and a second conductor pad connected to the conductor pad by the wiring and configured to electrically connect a second component, and the insulating layer has a second component region covered by the second component when the second component is electrically connected to the second conductor pad of the conductor layer.

14. The wiring substrate according to claim 1, wherein the optical waveguide is formed such that the side surface of the core part has the exposed portion on a first end side of the core part and is facing an opposite direction with respect to the insulating layer on a second end side of the core part on an opposite side with respect to the first end side.

15. The wiring substrate according to claim 14, wherein the conductor layer includes a third conductor pad configured to electrically connect a third component, and the insulating layer has a third component region covered by the third component electrically connected to the third conductor pad when the third component is electrically connected to the third conductor pad of the conductor layer such that the side surface of the core part is exposed in the third component region on the second end side of the core part.

16. The wiring substrate according to claim 15, wherein the conductor layer includes a wiring and a second conductor pad connected to the conductor pad by the wiring and configured to electrically connect a second component, and the insulating layer has a second component region covered by the second component when the second component is electrically connected to the second conductor pad of the conductor layer.

17. The wiring substrate according to claim 1, wherein the conductor post is formed such that the conductor post has a substantially constant width from the conductor pad to an opposite side with respect to the conductor pad.

18. The wiring substrate according to claim 1, wherein the conductor post is formed such that the conductor post is protruding from a surface of the covering layer on an opposite side with respect to the insulating layer.

19. The wiring substrate according to claim 1, further comprising:
   a connection layer formed on an end surface of the conductor post on an opposite side with respect to the conductor pad and comprising a material having a melting point that is lower than a melting point of the conductor post.

20. The wiring substrate according to claim 19, wherein the conductor post is formed such that a distance between an end surface of the conductor post on an opposite side with respect to the conductor pad and the surface of the insulating layer is shorter than a distance between the exposed portion of the core part and the surface of the insulating layer, and the connection layer is formed such that a distance between a surface of the connection layer on an opposite side with respect to the conductor post and the surface of the insulating layer is longer than the distance between the exposed portion and the surface of the insulating layer.

* * * * *